US012724354B2

(12) United States Patent
Mathijssen et al.

(10) Patent No.: US 12,724,354 B2
(45) **Date of Patent: *Sep. 1, 2026**

(54) METHOD FOR INFERRING A LOCAL UNIFORMITY METRIC

(71) Applicant: ASML NETHERLANDS B.V., Veldhoven (NL)

(72) Inventors: Simon Gijsbert Josephus Mathijssen, Rosmalen (NL); Kaustuve Bhattacharyya, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 18/533,109

(22) Filed: Dec. 7, 2023

(65) Prior Publication Data

US 2024/0168388 A1 May 23, 2024

Related U.S. Application Data

(63) Continuation of application No. 17/800,346, filed as application No. PCT/EP2021/052376 on Feb. 2, 2021, now Pat. No. 11,886,125.

(30) Foreign Application Priority Data

Mar. 2, 2020 (EP) .................................... 20160404
Mar. 10, 2020 (EP) .................................... 20161969

(51) Int. Cl.
*G03F 7/00* (2006.01)

(52) U.S. Cl.
CPC ................................ *G03F 7/70625* (2013.01)

(58) Field of Classification Search
CPC ......................... G03F 7/70625; G03F 7/70633
See application file for complete search history.

(56) References Cited

U.S. PATENT DOCUMENTS 10,025,199 B2 7/2018 Den Boef et al.
10,289,008 B2 5/2019 Jak
(Continued)

FOREIGN PATENT DOCUMENTS

KR 2017-0015453 2/2017
KR 2019-0093635 8/2019
(Continued)

OTHER PUBLICATIONS

International Search Report and Written Opinion issued in corresponding PCT Patent Application No. PCT/EP2021/052376, dated Apr. 13, 2021.

(Continued)

*Primary Examiner* — Deoram Persaud
(74) *Attorney, Agent, or Firm* — Pillsbury Winthrop Shaw Pittman, LLP

(57) ABSTRACT

A method of inferring a value for at least one local uniformity metric relating to a product structure, the method including: obtaining intensity data including an intensity image relating to at least one diffraction order obtained from a measurement on a target; obtaining at least one intensity distribution from the intensity image; determining, from the at least one intensity distribution, an intensity indicator expressing a variation of either intensity over the at least one diffraction order, or a difference in intensity between two complimentary diffraction orders over the intensity image; and inferring the value for the at least one local uniformity metric from the intensity indicator.

20 Claims, 3 Drawing Sheets

(56) References Cited

U.S. PATENT DOCUMENTS

2006/0033921 A1 2/2006 Den Boef et al.
2008/0140365 A1* 6/2008 Kawakami ................ G03F 1/36 703/2
2010/0201963 A1 8/2010 Cramer et al.
2010/0328655 A1 12/2010 Den Boef
2011/0027704 A1 2/2011 Cramer et al.
2011/0043791 A1 2/2011 Smilde et al.
2011/0069292 A1 3/2011 Den Boef
2011/0102753 A1 5/2011 Van De Kerkhof et al.
2011/0292365 A1* 12/2011 Cramer .............. G01N 21/4785 356/237.5
2012/0044470 A1 2/2012 Smilde et al.
2012/0052418 A1* 3/2012 Tian .................... G03F 7/70433 430/5
2012/0123581 A1 5/2012 Smilde et al.
2013/0258310 A1 10/2013 Smilde et al.
2013/0271740 A1 10/2013 Quintanilha
2018/0216930 A1* 8/2018 Ur-Rehman ........... G01B 11/30
2018/0364036 A1 12/2018 Jak et al.
2019/0025706 A1* 1/2019 Coenen .................. G01B 15/08
2019/0204755 A1* 7/2019 Kicken ............... G03F 7/70516
2019/0354024 A1* 11/2019 Tsiatmas ............... G03F 7/7065
2020/0124983 A1* 4/2020 Badr ................... G03F 7/70616
2021/0318627 A1* 10/2021 Elazhary ............... G03F 9/7049
2021/0364929 A1* 11/2021 Hsu ..................... G03F 7/70258
2022/0327364 A1* 10/2022 Hunsche ................. G03F 7/705
2022/0357672 A1* 11/2022 Staals ................. G03F 7/70625
2023/0040124 A1* 2/2023 Nienhuys ............ G03F 7/70558
2023/0134093 A1* 5/2023 Mack .................... H01J 37/222 382/108

FOREIGN PATENT DOCUMENTS

WO 2013178422 12/2013
WO 2017186483 11/2017
WO 2018233947 12/2018

OTHER PUBLICATIONS

Anonymous: “Model local overlay variation determination using scatterometer”, Research Disclosure, vol. 665, No. 53 (Sep. 1, 2019).
Kong, D. et al.: “Measuring local CD uniformity in EUV vias with scatterometry and machine learning”, Proc. of SPIE, vol. 11325 (Feb. 26, 2020).
Office Action issued in corresponding Korean Patent Application No. 10-2022-7029949, dated Dec. 24, 2024.

* cited by examiner

SO
BD
IL
AD
IN
CO
LA
MA
$M_2$
$M_1$
B
PM
MT
W
$P_1$
$P_2$
PS
Z
X
Y
RF
AS
LS
WTa
WTb
IF
PW
EXP
MEA
MET
SCS
LC
SC x 4
I/O1
I/O2
BK
CH
RO
TCU
LB
LACU
DE x 4

METHOD FOR INFERRING A LOCAL UNIFORMITY METRIC

This application is a continuation of U.S. patent application Ser. No. 17/800,346, filed Aug. 17, 2022, which is the U.S. national phase entry of PCT Patent Application No. PCT/EP2021/052376 which was filed on Feb. 2, 2021, which claims priority of European Patent Application No. 20160404.8, filed on Mar. 2, 2020, and of European Patent Application No. 20161969.9, filed on Mar. 10, 2020, each of the foregoing applications is incorporated herein in its entirety by reference.

FIELD

The present description relates to a metrology apparatus and methods usable, for example, to perform metrology in the manufacture of devices by lithographic techniques. The description further relates to such methods for monitoring a local uniformity metric in a lithographic process.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a diffraction "spectrum" from which a property of interest of the target can be determined.

Examples of known scatterometers include angle-resolved scatterometers of the type described in US2006033921A1 and US2010201963A1. The targets used by such scatterometers are relatively large, e.g., 40 μm by 40 μm, gratings and the measurement beam generates a spot that is smaller than the grating (i.e., the grating is underfilled). Examples of dark field imaging metrology can be found in international patent applications US20100328655A1 and US2011069292A1 which documents are hereby incorporated by reference in their entirety. Further developments of the technique have been described in published patent publications US20110027704A, US20110043791A, US2011102753A1, US20120044470A, US20120123581A, US20130258310A, US20130271740A and WO2013178422A1. These targets can be smaller than the illumination spot and may be surrounded by product structures on a wafer. Multiple gratings can be measured in one image, using a composite grating target. The contents of all these patent application publications are also incorporated herein by reference.

SUMMARY

Today's patterning performance is driven by edge placement errors (EPE). The position of the edge of a feature is determined by the features lateral position (Overlay) and the size of the feature (CD). Part of this is very local and stochastic in nature; e.g., dependent on local overlay (LOVL) and local CD uniformity (LCDU). Also, Line Edge Roughness (LER) and line width roughness (LWR) may result in very local CD variations. All of these may be important contributors to the EPE performance.

Currently measurement of these local contributors to EPE may be done using CD-SEM inspection. However, this is too slow for many applications.

It would be desirable to provide a faster method for monitoring EPE and parameters which contribute thereto.

In an aspect, there is provided a method of inferring a value for at least one local uniformity metric relating to a product structure, the method comprising: obtaining intensity data comprising an intensity image relating to at least one diffraction order obtained from a measurement on a target; obtaining at least one intensity distribution from said intensity image; determining from said at least one intensity distribution an intensity indicator expressing a variation of either intensity over the at least one diffraction order, or a difference in intensity between two complimentary diffraction orders over the intensity image; and inferring the value for the at least one local uniformity metric from the intensity indicator.

In an aspect, there is provided a metrology apparatus, comprising: a support for said substrate having at least one of said targets and said product structure thereon; an optical system for measuring each target; a processor; and a computer program carrier comprising a computer program operable such that the processor can control the metrology apparatus to perform the method of the first aspect.

In an aspect, there is provided a computer program product comprising machine-readable instructions for causing a processor to perform a method as described herein, and associated metrology apparatus, lithographic system and method of manufacturing devices.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF EXEMPLARY EMBODIMENTS

Before describing embodiments of the invention in detail, it is instructive to present an example environment in which embodiments of the present invention may be implemented.

Figures 1, 2:
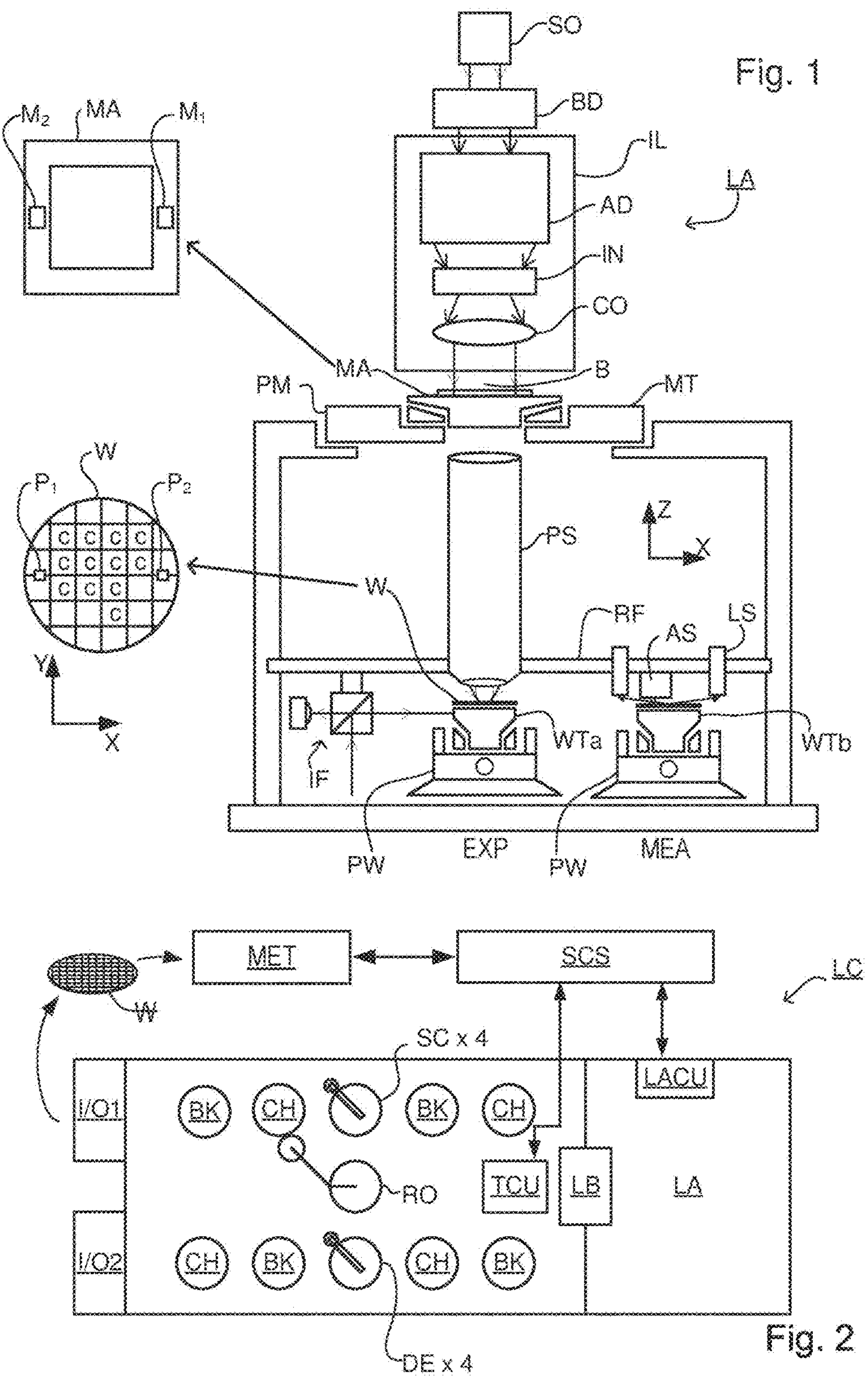
FIG. 1 depicts a lithographic apparatus.
FIG. 2 depicts a lithographic cell or cluster in which an inspection apparatus according to an embodiment of the present invention may be used.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can take many forms; the patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing a digital form of pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., reticle/mask) MA with respect to the path of the radiation beam B, e.g., after mechanical retrieval from a mask library, or during a scan.

Patterning device (e.g., reticle/mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment mark may also be included within dies, in amongst the device features, in which case it is desirable that the markers be as small as possible and not require any different imaging or process conditions than adjacent features. The alignment system, which detects the alignment markers is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

As shown in FIG. 2, the lithographic apparatus LA forms part of a lithographic cell LC, also sometimes referred to as a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which lithocell LC is located also includes metrology system MET which receives some or all of the substrates W that have been processed in the lithocell. Metrology results are provided directly or indirectly to the supervisory control system SCS. If errors are detected, adjustments may be made to exposures of subsequent substrates, especially if the inspection can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Within metrology system MET, an inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figures 3, 4:
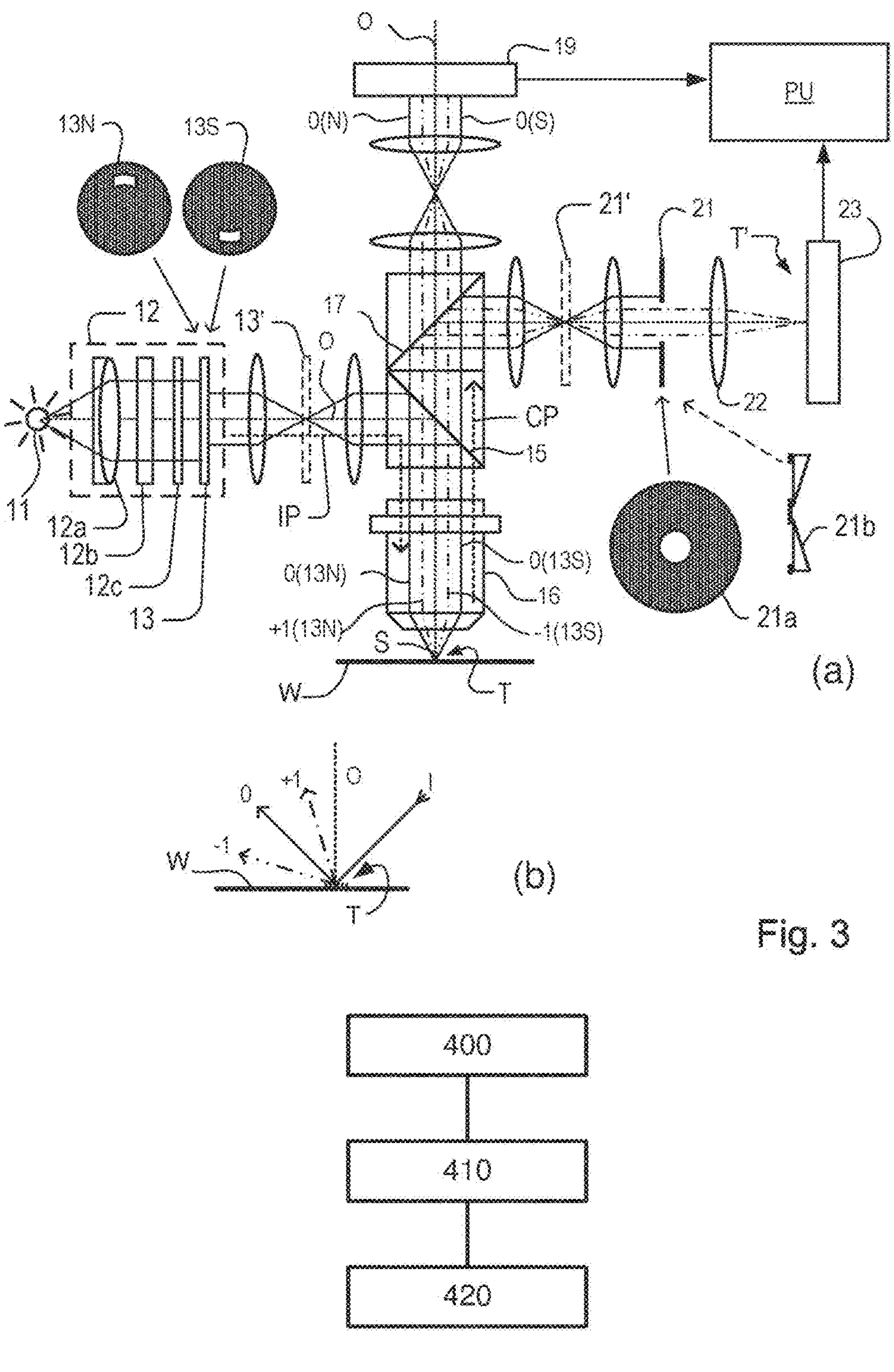
FIG. 3 illustrates schematically an inspection apparatus adapted to perform angle-resolved scatterometry and dark-field imaging inspection methods.
FIG. 4 is a flowchart describing a method according to an embodiment of the invention.

A metrology apparatus suitable for use in embodiments of the invention is shown in FIG. 3(*a*). Note that this is only one example of a suitable metrology apparatus. An alternative suitable metrology apparatus may use EUV radiation such as, for example, that disclosed in WO2017/186483A1. A target structure T and diffracted rays of measurement radiation used to illuminate the target structure are illustrated in more detail in FIG. 3(*b*). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

As shown in FIG. 3(*b*), target structure T is placed with substrate W normal to the optical axis O of objective lens 16. The substrate W may be supported by a support (not shown). A ray of measurement radiation I impinging on target structure T from an angle off the axis O gives rise to a zeroth order ray (solid line 0) and two first order rays (dot-chain line +1 and double dot-chain line −1), hereafter referred to as a pair of complementary diffraction orders. It should be noted that the pair of complementary diffraction orders may be any higher order pair; e.g., the +2, −2 pair etc. and is not limited to the first order complementary pair. It should be remembered that with an overfilled small target structure, these rays are just one of many parallel rays covering the area of the substrate including metrology target structure T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the target structures and the illumination angles can be designed or adjusted so that the first order rays entering the objective lens are closely aligned with the central optical axis. The rays illustrated in FIGS. 3(*a*) and 3(*b*) are shown somewhat off axis, purely to enable them to be more easily distinguished in the diagram.

At least the 0 and +1 orders diffracted by the target structure T on substrate W are collected by objective lens 16 and directed back through beam splitter 15. Returning to FIG. 3(*a*), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled 1(S)) are the ones which enter the lens 16.

A second beam splitter 17 divides the diffracted beams into two measurement branches. In a first measurement branch, optical system 18 forms a diffraction spectrum (pupil plane image) of the target structure on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction.

In the second measurement branch, optical system 20, 22 forms an image of the target structure T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

Local stochastic metrics or local variation metrics, such as local critical dimension uniformity (CDU), local overlay (LOVL) uniformity and line width roughness (LWR) and/or line edge roughness (LER) are all contributors to the edge placement error (EPE) budget. These effects manifest in dimension variations which are too small to measure using relatively fast metrology tools such as scatterometers, and are therefore monitored using scanning electron microscopes (SEM) or similar tools. However, SEM measurements are slow and cannot be used for wafer-to-wafer metrology in a practical high volume manufacturing setting. As such, there is presently no methods to monitor EPE budget variation which are sufficiently fast to allow monitoring wafer-to-wafer.

Methods will be described which will allow measurement of one or more of these stochastic or variation metrics faster than present, and sufficiently fast to enable monitoring of local EPE uniformity (LEPE) wafer-to-wafer. In particular, methods which enable such measurements to be performed using a scatterometer or interferometer based tool (or any other radiometric measurement tool capable of radiometric measurements) will be described. Such a tool may be a scatterometry based metrology device MET as illustrated in FIG. 2, or the specific metrology device or similar illustrated in FIG. 3. Alternatively or in addition, such a tool may be an alignment sensor such as that labelled AS in FIG. 1.

The method may comprise performing an intensity measurement on a suitable periodic target, relating to the intensity of at least one (non-zeroth) diffraction order. Typically the intensity is represented by an intensity image of the at least one diffraction order, the image made up of intensity values corresponding to their associated coordinates, such as pupil coordinates relating to the scatterometer. Alternatively the coordinates relate to an angle within an angular spectrum of the radiation within said at least one diffraction order. The target may be a periodic target with sufficiently large pitch to be measured using the metrology tool, but sub-segmented to mimic the product feature behavior. The measurement may comprise an overfilled measurement. An intensity distribution can be determined from the intensity measurement, the intensity distribution describing the variation of intensity over the intensity image.

In a preferred embodiment, instead of raw intensity data, asymmetry data (e.g., intensity asymmetry data) may be used. For raw intensity data, the intensity signal may correlate with other symmetrical variations in the target (e.g., a local layer thickness variation). By using asymmetry data, such symmetrical effects which are not correlated with the uniformity parameter of interest will be substantially filtered out. The remainder of the description will describe embodiments where asymmetry data is used; however they are also applicable to embodiments which use raw intensity data.

As such, an asymmetry distribution can be determined from the asymmetry measurement, the asymmetry distribution describing the variation of asymmetry over an asymmetry image. An asymmetry image may comprise, for example, a difference image between a first image or first radiometric measurement from a first one of a pair of complementary diffraction orders diffracted from the target and a second image or second radiometric image from the second one of the a pair of complementary diffraction orders. For example, the asymmetry image may be the difference of a first image or +1 image from the +1 diffraction order and a second image or −1 image from the −1 diffraction order. As such, the asymmetry distribution may be described by an intensity difference distribution over the asymmetry image.

FIG. 4 is a high-level flow diagram describing a method encompassing the abovementioned concepts. At step 400, a calibration step is performed to establish a correlation between one or more local variation metrics within a dedicated metrology structure and a parameter of interest, such as LEPE, on product. The calibration may comprise performing first calibration measurements on a calibration wafer (which may be an actual product wafer or specially exposed calibration wafer) using a metrology tool which will be used for actual product monitoring in the next step and second calibration measurements using a verification tool able to directly measure the local variation metric (e.g., an SEM or e-beam tool).

For example, the first calibration measurements may comprise an asymmetry distribution, for example a measure of the distribution within an asymmetry image. Such an asymmetry distribution may comprise asymmetry as a function of target position (or detector position/pixel) or function of scan time (e.g., for some alignment sensors or similar devices which measure a signal as a function of time, rather than an image). This description may be described by a single asymmetry indicator, such as a width (or other suitable dimension) of an asymmetry histogram (e.g., describing asymmetry within a single asymmetry image). Any suitable position for taking the width measurement can be used (e.g., full-width-half-maximum FWHM, full-width-tenth-maximum FWTM or anywhere else). The inventors have deduced that the width of an asymmetry histogram (or any other suitable asymmetry metric or asymmetry indicator) is a suitable metric for deducing a local uniformity metric and can be correlated to such.

As has been described, an alignment sensor may be used for obtaining the asymmetry data. In the context of using an alignment sensor, the determined asymmetry data may describe a local alignment position difference (e.g., color-2-color) while scanning over a target.

For correlation, the calibration wafer may comprise both targets and product structure (or product-like structures which sufficiently mimic product structure), with the first calibration measurements being performed on the targets and the second calibration measurements performed on the product structures/product-like structures. The targets may be similar or the same as will be used during the actual product monitoring in the next step. The form of the targets will be described in more detail below in combination with FIG. 5. Generally speaking, the targets may be periodic targets of sufficient pitch to be measured by the scatterometer/interferometer based tool, subsegmented with product-like structures such that its exposure behavior mimics that of the product structures. In an embodiment, the product-like subsegmentation may be made to be more sensitive to errors than the product, rather than directly mimic the product behavior.

Any suitable calibration or correlation technique can be used to establish the relationship between the first calibration measurements and second calibration measurements. This may comprise a direct correlation of the asymmetry indicator to the SEM measurements (e.g., of LEPE or other local uniformity parameter(s) which contributes to LEPE), for example by determining a suitable regression model or similar. Alternatively a machine learning model may be trained on the sets of measurement such that it can infer LEPE (or other local uniformity parameter(s)) from future asymmetry indicator measurements.

In an embodiment, the first calibration measurements may be performed with radiation having multiple measurement conditions enabling separation of different local uniformity metrics. For example, radiation comprising two or more wavelengths can enable each of two or more different uniformity metrics to be disentangled. This may comprise, for example, measuring asymmetry histograms as a function of wavelength (or a function of different combinations of wavelengths or measurement conditions) and separately correlating each of the corresponding asymmetry indicators (or other asymmetry metrics) to the different SEM measurements for different metrics (e.g., correlate a first wavelength asymmetry indicator to LCDU, a second wavelength asymmetry indicator to LOVL etc.). In this manner, two or more local uniformity metrics such as (for example) LCDU, LER, LWR, LOVL and LEPE can be monitored separately wafer-to-wafer.

At step 410, local EPE and/or one or more other local uniformity metrics can be monitored via radiometric measurements using, for example, a scatterometer or interferometer based tool. The measurement technique may be the same as already described for the first calibration measurements; e.g., measurement of one or more suitable subsegmented targets to obtain an asymmetry image for each target, determine an asymmetry indicator for each target, and infer EPE or other uniformity metric from the asymmetry indicator based on the calibration of the previous step. The measurement may be a multiple wavelength measurement (or, more generally, multiple measurement condition) enabling disentanglement of different local uniformity measurements if so calibrated in the previous step. As before, this may comprise determining histograms and asymmetry indicators as a function of measurement condition and using the correlations determined in the previous step to infer the corresponding metric.

At step 420, an action may be performed based on the inferred LEPE and/or other uniformity metric(s) measured at the previous step. This may comprise flagging wafers for further inspection (e.g., using an SEM) or even directly for rework. Errors can be fed back to the scanner to determine corrections to minimize the errors going forward (e.g., in a feedback process control loop), possibly on a wafer to wafer basis.

Other monitoring actions may comprise reticle qualification or resist qualification. For example, a monitor wafer may be exposed using the reticle which can then be measured using the techniques described to infer LEPE or other parameter. This can be indicative to how the reticle prints and therefore of any reticle or optical proximity control (OPC) errors.

Figures 5A, 5B, 5C:
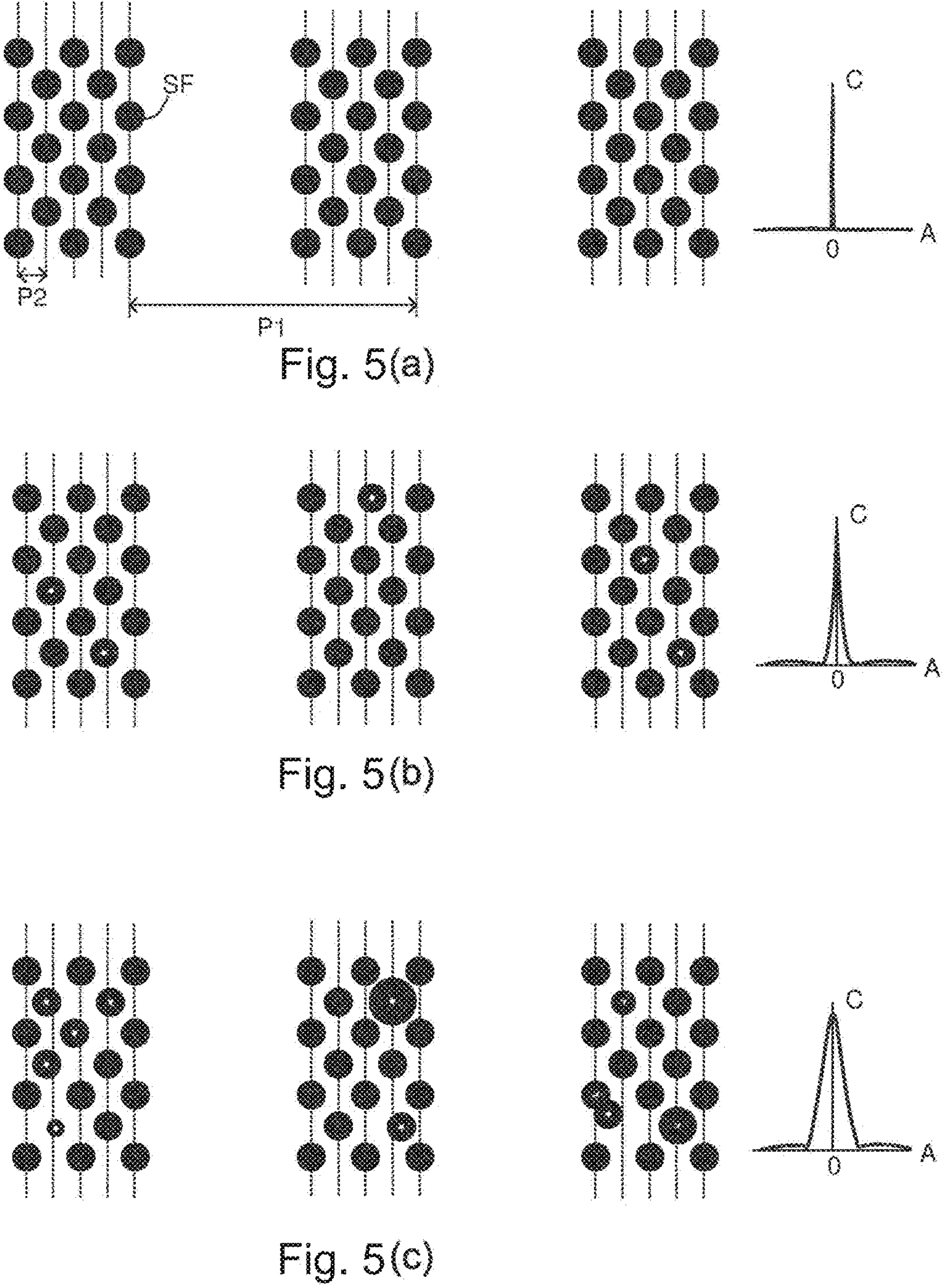
FIGS. 5(*a*) to (*c*) show an exemplary target usable in the method of FIG. 4, with different degrees of non-uniformity and corresponding asymmetry histograms.

FIG. 5 illustrates an example target usable in methods described herein, and corresponding example asymmetry histograms/indicators for different levels of error. FIG. 5(*a*) illustrates an example perfect target without any local edge placement non-uniformity (e.g., all elements of the target are formed with uniform size, shape and position). The target is a periodic target of pitch P1, where pitch P1 should be sufficiently large to be readable by the metrology device used for the monitoring (e.g., at step 410). For example P1 may be larger than 100 nm, larger than 300 nm or larger than 500 nm. The example shown is a subsegmented line-space target, but any subsegmented periodic target arrangement may be used (e.g., the space regions need not be empty, but can be filled with a different (contrasting) periodic structure or structures). The target shown has a periodic array in one direction, but targets in the two directions of the substrate plane may be provided (as different errors may correlate better to asymmetry in the other direction, for example).

Subsegmentation refers to the division or segmenting of each line (or each region of a set of periodic features, should the target comprise alternating first and second sets of contrasting regions of periodic features). The subsegmentation may have a second periodic pitch P2 which matches or is similar to the product pitch (e.g., the pitch of the product, assuming that the product is periodic). Each subsegment feature SF may also be similar or the same as a corresponding product feature. For example, the target illustrated here may be suitable for monitoring of product comprising a contact hole array, with each subsegment feature SF comprising a circle being similarly dimensioned (or smaller) than each contact hole of the array. In this manner, each of these subsegment features SF should behave in a similar manner to the product structures. As such, if the product comprises a periodic line-space structure, the subsegmentation may comprise a line-space subsegmentation of similar dimension; etc.

In an embodiment, instead of the subsegment features SF having substantially the same or similar dimensions and shape to mimic product behavior as close as possible, they may be made purposely more sensitive than the product, e.g., by moving them away from the center of their corresponding process window. This can be done, for example, by forming the subsegment features SF to be smaller than the equivalent product structure in a relevant dimension. For the example here, this may be achieved by forming the subsegment features SF with smaller diameter than the contact holes of the product. Note that the dotted lines are not part of the target design, but are a reference for the subsegment feature SF centers in the direction of periodicity.

To the right of the target in FIG. 5(*a*) is an asymmetry histogram (asymmetry on x-axis versus count on y-axis) describing asymmetry variation over the target (or asymmetry image thereof, e.g., per pixel). For this perfect target, there is no local EPE non-uniformity and therefore the histogram is a single spike, indicating all asymmetry values are substantially the same over the asymmetry image. Therefore, the asymmetry indicator value (if the width of histogram is used) would be zero or very small. For this target, the spike is at zero asymmetry indicating a completely symmetrical target, although a perfect target (in the context of this disclosure) may be asymmetrical without any local EPE non-uniformity (e.g., the histogram may still comprise a zero-width spike but at a non-zero asymmetry value).

FIG. 5(*b*) shows the same target in a more realistic real-world example, where there is some local EPE non-uniformity, although at a degree within in acceptable process margin or process window. It can be seen, for example, that five of the subsegment features SF (those comprising a white dot) are formed off-center (as highlighted with reference to the dotted lines). This will result in increased local EPE non-uniformity, which manifests itself in an increased width of the asymmetry histogram on the right of the Figure.

FIG. 5(*c*) shows the same target with very poorly controlled EPE, e.g., at a level which would be unacceptable in a manufacturing environment and unlikely to produce a yielding die. Numerous subsegment features SF (again those comprising a white dot) are formed with non-uniformities in size and position, with one pair touching. The histogram for this example is wider than the example of FIG. 5(*b*). As such, it can be appreciated that the width of such a histogram may be indicative of local non-uniformity and used as an indicator therefor. Note that in this example, different contributors to the EPE budget (e.g., position v. diameter) may be disentangled and monitored separately using two (or more) wavelengths, with the histograms determined per wavelength. This assumes separate calibration per wavelength has been done.

Further embodiments are disclosed in the list of numbered clauses below:

1. A method of inferring a value for at least one local uniformity metric relating to product structure, the method comprising:
   - obtaining intensity data relating to a measurement of a target and describing at least one intensity distribution per target position of the target;
   - determining at least one intensity indicator from said at least one intensity distribution; and
   - inferring the value for the at least one local uniformity metric from the at least one intensity indicator.

2. A method according to clause 1, wherein the target comprises a main pitch sufficiently large to be measured by a scatterometer based or interferometer based metrology tool.

3. A method according to clause 2, wherein the main pitch is larger than 300 nm.

4. A method according to any preceding clause, wherein the target is subsegmented, with each subsegment having the same, similar and/or smaller dimensions than said product structure, or elements thereof.

5. A method according to clause 4, wherein a pitch of the subsegmentation is similar to a pitch of the product structure, or elements thereof.

6. A method according to clause 4 or 5, wherein each subsegment has a similar or same shape as the product structure, or elements thereof.

7. A method according to any of clauses 4 to 6, wherein each subsegment having at least one smaller dimension than said product structure, or elements thereof to increase sensitivity to process variation than said product structure.

8. A method according to any preceding clause, wherein said method comprises measuring said target to obtain said intensity data.

9. A method according to clause 8, wherein the measuring is performed using an alignment sensor or post exposure metrology tool.

10. A method according to any preceding clause, wherein the intensity indicator comprises a measure of intensity or asymmetry variation within the intensity data.

11. A method according to clause 10, wherein the intensity indicator comprises a width of a histogram plot of the intensity data.

12. A method according to any preceding clause wherein, said intensity data comprises asymmetry data, each said at least one intensity distribution comprises an asymmetry distribution and the intensity indicator comprises an asymmetry indicator.

13. A method according to clause 12, wherein the asymmetry data comprises a per target position difference in intensity of a pair of complementary higher diffraction orders from diffraction of measurement radiation following said measurement of the target.

14. A method according to clause 12, wherein the asymmetry data comprises a local alignment position difference between different measurement settings, while scanning over the target.

15. A method according to any preceding clause, wherein the intensity data relates to a plurality of different measurement conditions, and the method comprises determining an intensity indicator for each measurement condition from an intensity distribution per measurement condition; and determining values for different local uniformity metrics respectively from each of said intensity indicators.

16 A method according to clause 15 wherein each measurement condition relates to a different wavelength or combination of wavelengths.

17. A method according to any preceding clause, wherein the method comprises an initial calibration step to calibrate each of said at least one intensity indicator to a respective one of said at least one local uniformity metric.

18. A method according to clause 17, wherein the calibration step comprises calibrating first calibration data measured from a target using a metrology tool of a similar or same type as that used to obtain said intensity data to second calibration data comprising direct measurements of said at least one local uniformity metric.

19. A method according to any preceding clause, wherein the at least one local uniformity metric comprises one or more of local overlay uniformity, local edge placement error uniformity, line width roughness, line edge roughness, and local critical dimension uniformity.

20. A method according to any preceding clause, comprising making a decision on a further inspection or rework based on the inferred value.

21. A method according to any preceding clause, comprising performing the steps to infer the value for the at least one local uniformity metric during a manufacturing process to manufacture integrated circuits.

22. A method according to clause 21, wherein the method is performed on at least one substrate per lot.

23. A method according to clause 21 or 22, wherein the method is performed on a plurality of substrates per lot.

24. A computer program comprising processor readable instructions which, when run on suitable processor controlled apparatus, cause the processor controlled apparatus to perform the method of any preceding clause.

25. A computer program carrier comprising the computer program of clause 24.

26. A metrology apparatus, comprising:

a support for said substrate having at least one of said targets and said product structure thereon;

an optical system for measuring each target;

a processor; and the computer program carrier of clause 25 such that the processor can control the metrology apparatus to perform the method of any of clauses 1 to 23.

27. A method of inferring a value for at least one local uniformity metric relating to a product structure, the method comprising: obtaining intensity data comprising an intensity image relating to at least one diffraction order obtained from a measurement on a target; obtaining at least one intensity distribution from said intensity image; determining from said at least one intensity distribution an intensity indicator expressing a variation of either intensity over the at least one diffraction order, or a difference in intensity between two complimentary diffraction orders over the intensity image; and inferring the value for the at least one local uniformity metric from the intensity indicator.

28. A method according to clause 27, wherein the target comprises a main pitch sufficiently large to be measured by a scatterometer based or interferometer based metrology tool.

29. A method according to clause 27 or 28, wherein the target is sub-segmented, with each subsegment having the same, similar and/or smaller dimensions than said product structure, or elements thereof.

30. A method according to clause 29, wherein each subsegment has a similar or same shape as the product structure, or elements thereof.

31. A method according to clause 29 or 30, wherein each subsegment has at least one smaller dimension than said product structure, or elements thereof to increase sensitivity to process variation compared to said product structure.

32. A method according to any of clauses 27 to 31, wherein said method comprises measuring said target to obtain said intensity data.

33. A method according to any of clauses 27 to 32, wherein the intensity data comprises at least two diffraction orders and the intensity indicator comprises a measure of intensity or asymmetry variation within the intensity data.

34. A method according to any of clauses 27 to 33, wherein the intensity indicator comprises a width of a histogram plot of the intensity distribution.

35. A method according to any of clauses 27 to 34, wherein, said intensity data comprises asymmetry data, each said at least one intensity distribution comprises an asymmetry distribution and the intensity indicator comprises an asymmetry indicator.

36. A method according to clause 35, wherein the asymmetry data comprises a per target position difference in intensity of a pair of complementary higher diffraction orders from diffraction of measurement radiation following said measurement of the target.

37. A method according to any of clauses 27 to 36, wherein the intensity data relates to a plurality of different measurement conditions, and the method comprises determining an intensity indicator for each measurement condition from an intensity distribution per measurement condition; and determining values for different local uniformity metrics respectively from each of said intensity indicators.

38 A method according to clause 37, wherein each measurement condition relates to a different wavelength or combination of wavelengths.

39. A method according to any of clauses 27 to 36, wherein the method comprises an initial calibration step to calibrate each of said at least one intensity indicator to a respective one of said at least one local uniformity metric.

40. A method according to clause 39, wherein the calibration step comprises calibrating first calibration data measured from a target using a metrology tool of a similar or same type as that used to obtain said intensity data to second calibration data comprising direct measurements of said at least one local uniformity metric.

41. A computer program product comprising machine readable instructions configured to infer a value for at least one local uniformity metric relating to a product structure, the instructions configured to: obtain intensity data comprising an intensity image relating to at least one diffraction order obtained from a measurement on a target; obtain at least one intensity distribution from said intensity image; determine from said at least one intensity distribution an intensity indicator expressing a variation of either intensity over the at least one diffraction order, or a difference in intensity between two complimentary diffraction orders over the intensity image; and infer the value for the at least one local uniformity metric from the intensity indicator.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The term target should not be construed to mean only dedicated targets formed for the specific purpose of metrology. The term target should be understood to encompass other structures, including product structures, which have properties suitable for metrology applications.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method comprising:

irradiating a physical target;

measuring radiation redirected by the target to obtain intensity data of the radiation directed by the target;

determining at least one intensity indicator from the intensity data, the at least one intensity indicator comprising a measure taken from at least one statistical distribution of intensity data and/or a statistical measure of the intensity data; and inferring, by a hardware computer and from the at least one intensity indicator, a value for at least one local uniformity metric of a device structure separate from the target.

2. The method according to claim 1, wherein the target comprises a main pitch sufficiently large to be measured by a scatterometer based or interferometer based metrology tool.

3. The method according to claim 1, wherein the target is subsegmented, with each subsegment having the same, similar and/or smaller dimensions than the device structure, or one or more elements thereof.

4. The method according to claim 3, wherein a pitch of the subsegmentation is similar to a pitch of the device structure, or elements thereof.

5. The method according to claim 3, wherein each subsegment has a similar or same shape as the device structure, or one or more elements thereof.

6. The method according to claim 3, wherein each subsegment has at least one smaller dimension than the product structure, or one or more elements thereof, to increase sensitivity to process variation than the product structure.

7. The method according to claim 1, wherein the measuring is performed using an alignment sensor or post exposure metrology tool.

8. The method according to claim 1, wherein the at least one intensity indicator comprises a measure of variation of intensity or of asymmetry, within the intensity data.

9. The method according to claim 1, wherein the at least one intensity indicator comprises a width of a histogram plot of the intensity data.

10. The method according to claim 1, wherein the intensity data comprises asymmetry data and the at least one intensity indicator comprises an asymmetry indicator.

11. The method according to claim 10, wherein the asymmetry data comprises a per target position difference in intensity of a pair of complementary higher diffraction orders from diffraction of measurement radiation following measurement of the target.

12. The method according to claim 10, wherein the asymmetry data comprises a local alignment position difference between different measurement settings, while scanning over the target.

13. The method according to claim 1, wherein the intensity data relates to a plurality of different measurement conditions, and the method comprises:

determining an intensity indicator for each measurement condition from an intensity distribution per measurement condition; and determining values for different local uniformity metrics respectively from each of the intensity indicators.

14. The method according to claim 13, wherein each measurement condition relates to a different wavelength or combination of wavelengths.

15. The method according to claim 1, further comprising an initial calibration step to calibrate each at least one intensity indicator to a respective one of the at least one local uniformity metric.

16. The method according to claim 1, wherein the at least one local uniformity metric comprises one or more selected from: local overlay uniformity, local edge placement error uniformity, line width roughness, line edge roughness, or local critical dimension uniformity.

17. The method according to claim 1, comprising performing the inferring the value for the at least one local uniformity metric during a manufacturing process to manufacture integrated circuits.

18. A non-transitory computer program carrier comprising stored instructions, the instructions, when run on suitable processor controlled apparatus, are configured to cause the processor controlled apparatus to at least:

obtain intensity data relating to a measurement of a target structure;

determine at least one intensity indicator from the intensity data, the at least one intensity indicator comprising a measure taken from at least one statistical distribution of intensity data and/or a statistical measure of the intensity data;

infer, from the at least one intensity indicator, a value for at least one local uniformity metric of a device structure separate from the target structure; and physically configure or cause a manufacturing or measuring process based on the at least one local uniformity metric and/or provide a signal representing, or based on, the at least one local uniformity metric to a system for use in physical configuration or causation of the manufacturing or measuring process.

19. A metrology apparatus, comprising:

a support for a substrate having the target structure and/or the device structure thereon;

an optical system configured to measure the target structure; and the computer program carrier of claim 18.

20. A non-transitory computer program carrier comprising stored instructions, the instructions, when run on suitable processor controlled apparatus, are configured to cause the processor controlled apparatus to at least:

cause or control irradiation of a physical target;

cause or control measurement of radiation redirected by the target to obtain intensity data of the radiation directed by the target;

determine at least one intensity indicator from the intensity data, the at least one intensity indicator comprising a measure taken from at least one statistical distribution of intensity data and/or a statistical measure of the intensity data; and infer, from the at least one intensity indicator, a value for at least one local uniformity metric of a device structure separate from the target.

* * * * *